US006965330B1

(12) United States Patent
Fossum

(10) Patent No.: US 6,965,330 B1
(45) Date of Patent: Nov. 15, 2005

(54) SYSTEM AND METHOD FOR IMPROVED QUALITY SIGNAL RE-SAMPLING USING A WEIGHTED SIGNAL AVERAGE

(75) Inventor: Gordon Clyde Fossum, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 10/897,346

(22) Filed: Jul. 22, 2004

(51) Int. Cl.[7] .............................................. H03M 13/00
(52) U.S. Cl. .................... 341/94; 375/240.27; 714/746
(58) Field of Search ............................ 341/94, 123, 61; 375/240.27; 708/530, 805, 445; 714/746, 714/764, 761, 774, 753

(56) References Cited

U.S. PATENT DOCUMENTS 5,742,740 A * 4/1998 McCormack et al. ......... 706/14
6,654,596 B1 * 11/2003 Jakobsson et al. .......... 455/324
2002/0095273 A1 * 7/2002 Tanizawa .................... 702/189
2003/0226098 A1 * 12/2003 Weng ......................... 714/798

* cited by examiner

*Primary Examiner*—John B Nguyen
(74) *Attorney, Agent, or Firm*—VanLeeuwen & VanLeeuwen; Scott A. Schmok; Diana R. Gerhardt

(57) ABSTRACT

A system and method to improve signal quality by including a weighted signal average in computations that calculate a regenerated signal's sampling values is presented. Secondary signal lobe values are removed from an original signal during signal re-sampling computations in order to minimize signal re-sampling memory requirements. A weighed signal average is included in signal re-sampling computations in order improve signal quality that was degraded due to the removal of the secondary signal lobe values. Weighted signal averages are calculated using error function values that are included in an error function. Each error function value corresponds to the distance between sample points of an original signal and the regenerated signal. The error function value is combined with the original signal's average signal value to produce a weighed signal average.

20 Claims, 8 Drawing Sheets

SYSTEM AND METHOD FOR IMPROVED QUALITY SIGNAL RE-SAMPLING USING A WEIGHTED SIGNAL AVERAGE

BACKGROUND OF THE INVENTION

1. Technical Field

The present invention relates in general to a system and method for improved quality signal re-sampling. More particularly, the present invention relates to a system and method for adding a weighed signal average to a re-sampled signal in order to reduce the re-sampled signal's output signal error.

2. Description of the Related Art

The advancement of the electronics industry has brought about an advancement of digital audio. Digital audio is an audio signal that is represented in digital format whereby the digital format includes a corresponding sample rate. A digital audio signal's sample rate is the number of samples the signal provides per second in order to represent an audio signal. The more samples per second a signal provides, the more accurate the digital representation of the audio signal. For example, the current sample rate for CD-quality audio is 44,100 samples per second, which reproduces audio frequencies up to 20,500 hertz.

In addition to CD quality audio, other digital audio formats are becoming industry standards. For example, DAT (Digital Audio Tape) is a standard medium and technology for digitally recording audio on tape at a professional quality level. For example, professional and semi-professional recording studios use DAT to archive master recordings. A DAT drive is a digital tape recorder with rotating heads similar to those found in a video deck, and typically record at sample rates of 48,000 samples per second.

Since multiple digital audio standards exist, users may wish to convert, or re-sample a digital audio signal from one format to another format. For example, a user may wish to convert a CD digital audio signal at 44,100 samples per second to a DAT digital audio signal at 48,000 samples per second. When performing digital audio re-sampling, a decision is made as to how many input samples to use when generating an output sample. In theory, a user may use an infinite amount of input samples to reproduce an output sample, which results in no output signal error. In reality, a user determines a finite number of input samples to use when generating an output signal, which, in turn, induces signal error.

A challenge found in determining how many input samples to use, however, is that consequences result, regardless of a user's sample quantity choice. If a user chooses a small input sample quantity, the output signal accrues a large signal error from clipping the input samples to a small finite number. On the other hand, if a user chooses a large sample quantity, the output signal accrues a small signal error, but the re-sampling process take a tremendous amount of memory and processing power.

What is needed, therefore, is a system and method to use a small input sample quantity to re-produce a quality digital audio signal by minimizing the re-produced signal's error.

SUMMARY

It has been discovered that the aforementioned challenges are resolved by adding a weighted signal average to an output sample value whereby the weighted signal average is a function of the temporal placement of the desired output sample value relative to its neighboring input sample values.

A processor generates an error function that includes a plurality of error function values. The processor computes incremental output sample values for a particular output sample point using function weightings that correspond to a plurality of input sample points. Each incremental output sample value is accumulated into an accumulated output sample value. The processor identifies a sampling fraction that corresponds to the distance between the output sample point and an input sample point, and computes a weighted signal average using the sampling fraction. The weighted signal average is added to the accumulated output sample value, which results in a corrected output sample value for the particular output sample point.

The processor scales an input time value "x" by multiplying "x" by the value (Pi*F) where F is the frequency of the input signal, which results in a new, scaled, input time value "x_s" where x_s=Pi*F*x. The scaled function becomes S(x)=sin(x_s)/(x_s), which is expanded to S(x) =sin(pi*F*x)/(pi*F*x). In turn, S(x) crosses the x axis at the same frequency as the input sample points. The processor uses the scaled function to identify function weightings for each input sample point. The function weightings are used to generate incremental output sample values, which are accumulated into an accumulated output sample value.

In addition, the processor generates an error function corresponding to the number of input samples that a user selects to generate an output sample. The error function spans between two input sample points whereby the left and right edges of the error function correspond to an output sample point at the same location as an input sample point. The middle of the error function corresponds to an output sample point halfway between two input sample points. For example, if an output sample point matches the location of an input sample point, the resulting output sample value does not require the addition of a weighted signal average (i.e. the error function value is zero). In another example, if an output sample point is halfway between two input sample points, the resulting output sample value requires the addition of a maximum weighted signal average (i.e. the error function is at its maximum value).

The processor uses the error function to compute a functional value at a point corresponding to the temporal distance between the desired output sample point and the nearest input sample point. The functional value (i.e. weighting value) is multiplied by the average signal value to generate a weighted signal average. The weighted signal average is derived from the observation that sin(x)/x values are weighting factors, which, when summed from negative infinity to positive infinity, equate to exactly 1.0. The act of taking a finite sample instead of an infinite sample results in a weighting factor that is less than 1.0. The gap between this result and 1.0 is the weighting factor that is applied to the best approximation of the missing values (i.e. the average signal value). The processor adds the weighted signal average to the accumulated output sample value, which results in a corrected output sample value. An output signal is generated using each corrected output sample value that corresponds to each output sample point.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The following is intended to provide a detailed description of an example of the invention and should not be taken to be limiting of the invention itself. Rather, any number of variations may fall within the scope of the invention which is defined in the claims following the description.

Figure 1:
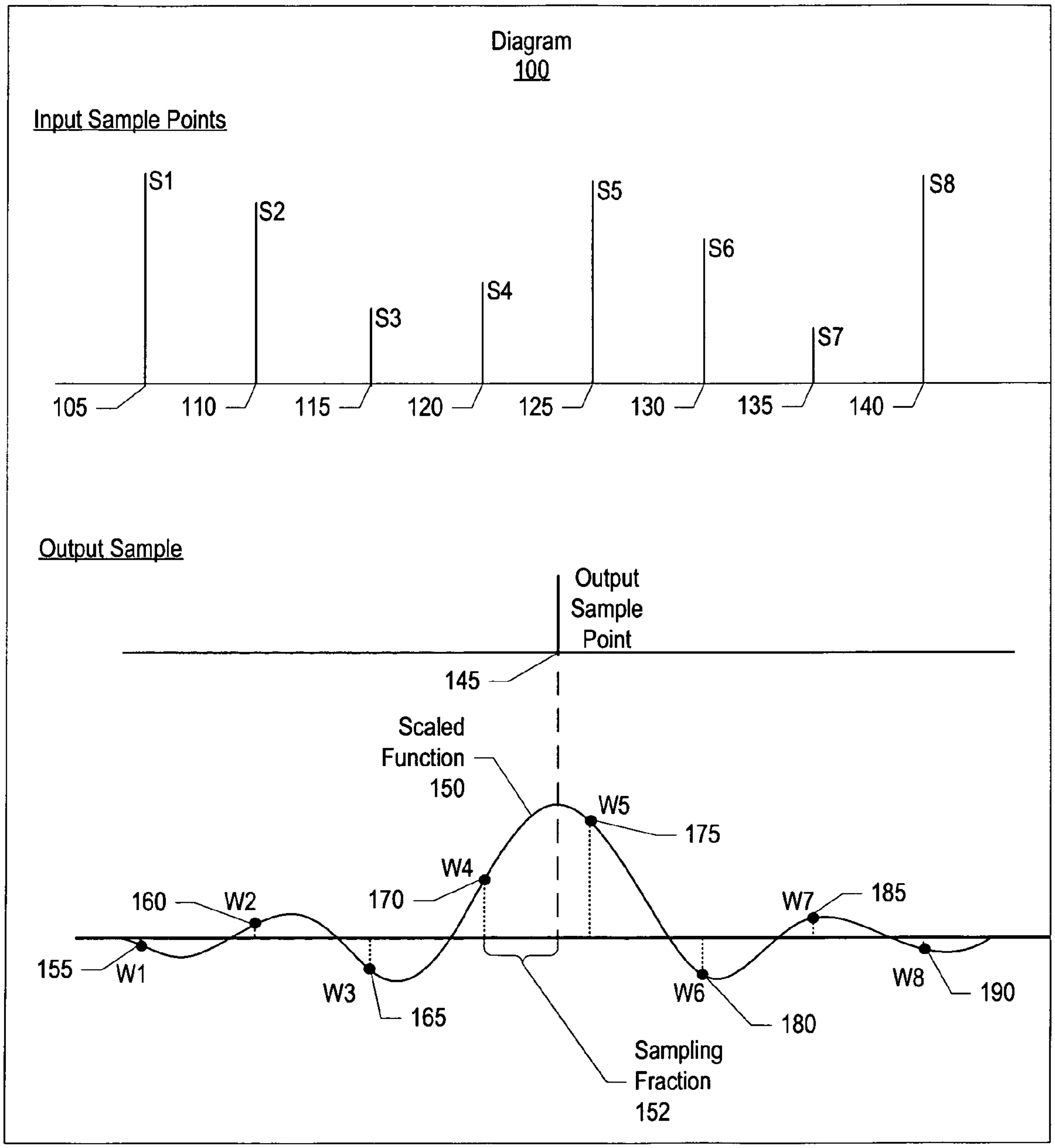
FIG. 1 is a diagram showing a scaled function that is scaled to an input sample rate, and centered on an output sample point.

FIG. 1 is a diagram showing a scaled function that is scaled to an input sample rate, and centered on an output sample point. A processor uses the scaled function to generate incremental output sample values based upon a particular amount of input sample points. The processor accumulates the incremental output sample values, and adds a weighted signal average to the accumulated output sample value in order to generate a corrected output sample value (see FIG. 3 and corresponding text for further details regarding final output sample generation steps).

Diagram 100 shows input sample points 105 through 140 that correspond to an input signal with a particular input sample rate, such as 44 KHz. Input sample points 105 through 140 are spaced at the input sample rate, and each input sample point has a corresponding input sample value. Diagram 100 also shows output sample point 145, which corresponds to a particular output sample rate, such as 48 KHz.

A processor generates scaled function 150, which is scaled based upon the input sample rate and is centered on output sample point 145. Scaled function 150 is such that the function crosses the x-axis at the same frequency as the input sample rate. Since the scaled function is scaled to the input sample rate, there in one input sample between the center of the function and the point at which the function crosses the x-axis (see FIG. 5 and corresponding text for further details regarding scaled function generation).

Diagram 100 also shows sampling fraction 152. Sampling fraction 152 is based upon the distance between output sample point 145 and input sample point 120. A processor uses the sampling fraction to identify an error function value that is used to generate a weighted signal average. If the distance between the output sample point and the mid-point between two input sample points is large, the sampling fraction is large and, therefore, a larger error function value is required to compute a weighted signal average. Conversely, if the distance between the output sample point and the mid-point between two input sample points is small, the sampling fraction is small and, therefore, a processor uses a smaller error function value to compute a weighted signal average (see FIGS. 2, 4, 5, and corresponding text for further details regarding error functions and weighted signal averages).

Diagram 100 shows function weightings 155 through 190 that lie on scaled function 150 and correspond to input sample points 105 through 140, respectively. Processing computes a denominator that is the absolute value of the scaled distance (SD) from the temporal location of the desired output signal to the temporal location of the input sample in question. For example, if the scaling fraction is 0.8, the scaled distances to the six closest neighbors (three on the left and three on the right) are (2.2*Pi), (1.2*Pi), (0.2*Pi), (0.8*Pi), (1.8*Pi) and (2.8*Pi). Function weightings 155 through 190 are calculated for output sample point 145 using the following formula:

$$\text{Function Weighing} = \frac{\sin\,(\text{Sampling Fraction} * Pi)}{(\text{Scaled Distance} * Pi)}$$

Each function weighting for each input sample point is multiplied by its corresponding input sample value, resulting in a plurality of incremental output sample values. The accumulation of each of the incremental output samples for input sample points 105 through 140 results in an accumulated output sample value. A processor also uses sampling fraction 152 in order to identify an error function value corresponding to an error function (see FIG. 2 and corresponding text for further details regarding error function properties). The processor then computes a weighted signal average using the error function value and an average signal value, and acids the weighted signal average to the accumulated output signal value in order to generate a corrected output sample value for output sample point 145 (see FIGS. 3, 4, 5 and corresponding text for further details regarding final output sample generation steps).

Figure 2:
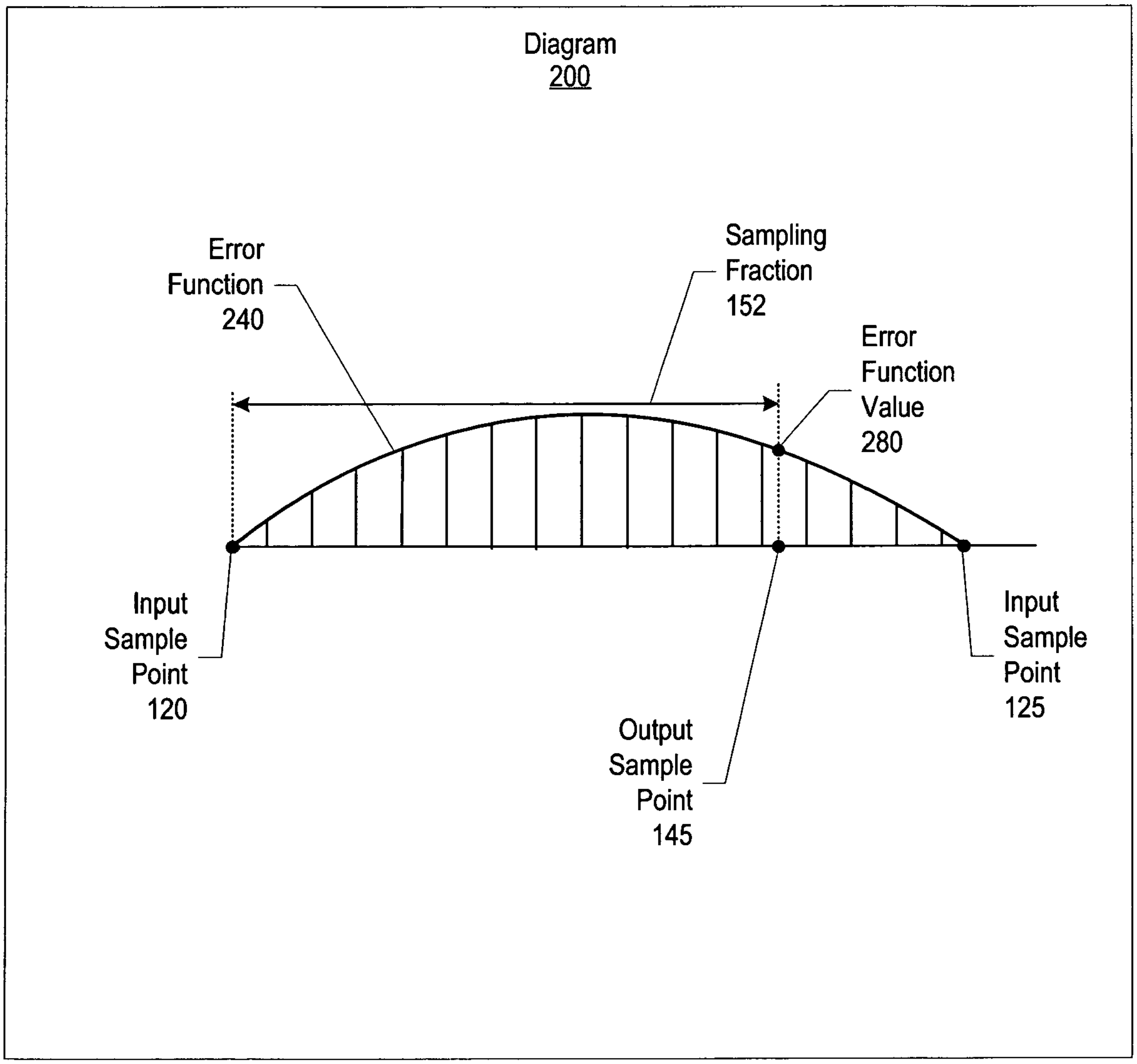
FIG. 2 is a diagram showing an error function spanning between two input sample points.

FIG. 2 is a diagram showing an error function spanning between two input sample points. A processor generates an error function based upon the number of input samples that a processor uses to generate an output sample. The processor generates error function interval values for a plurality of error function interval points, whereby the error function interval points segment the error function into a particular number of intervals. The higher number of error function interval points, the more accurate the error function.

Diagram 200 shows error function 240 between input sample point 120 and input sample point 125. Input sample points 120 and 125 are the same as that shown in FIG. 1. The left and right edges of error function 240 correspond to an output sample point at the same location as an input sample point. The middle of error function 240 corresponds to an output sample point halfway between two input sample points. For example, if an output sample point matches the location of an input sample point, the resulting output sample value does not require the addition of a weighted signal average (i.e. the error function value is zero). In another example, if an output sample point is halfway between two input sample points, the resulting output sample value requires the addition of a maximum weighted signal average (i.e. the error function is at its maximum value).

Diagram 200 shows an example of the location of an output sample point (e.g. output sample point 145). Output sample point 145 is approximately ¾ of the distance between input sample point 120 and input sample point 125. As such, the sampling fraction (e.g. sampling fraction 152) is 0.75. A processor uses sampling fraction 152 in order to identify an error function value (e.g. error function value 280), which is multiplied with an average signal value in order to compute a weighted signal average (see FIG. 5 and corresponding text for further details regarding weighted signal average computations). Output sample point 145 and sampling function 152 are the same as that shown in FIG. 1.

Figure 3:
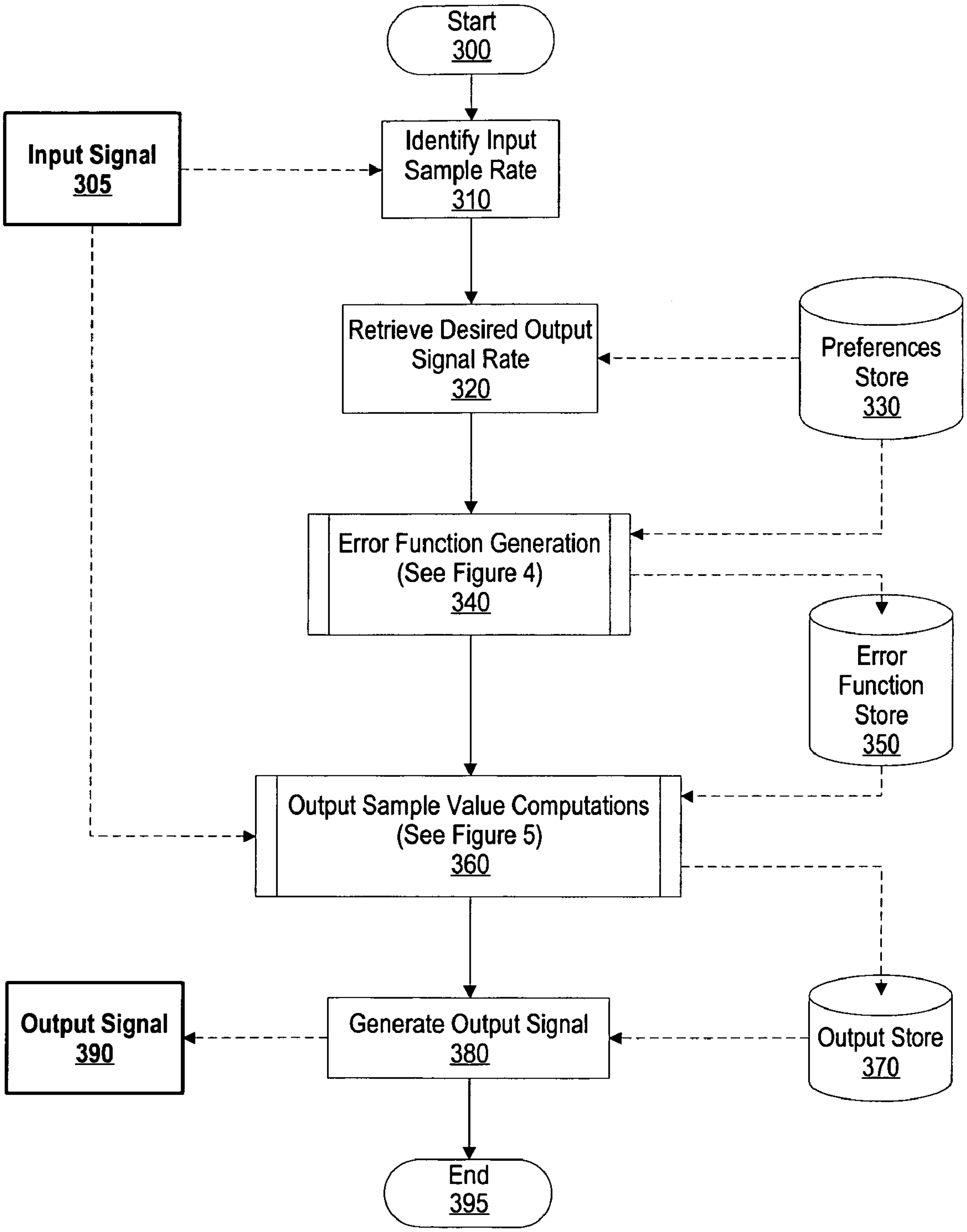
FIG. 3 is a high-level flowchart showing steps taken in generating an output signal from an input signal and a weighted signal average.

FIG. 3 is a high-level flowchart showing steps taken in generating an output signal from an input signal and a weighted signal average. Processing commences at 300, whereupon processing identifies an input sample rate corresponding to input signal 305. For example, the input sample rate of input signal 305 may be 44 KHz. At step 320, processing retrieves a desired output signal rate that is located in preferences store 330. For example, a user may specify a desired output signal rate of 48 KHz, and store his preference in preferences store 330 during configuration set-up. Preferences store 330 may be stored on a nonvolatile storage area, such as a computer hard drive.

Processing generates an error function using an input sample quantity that it retrieves from preferences store 330, and stores the error function in error function store 350. The input sample quantity identifies an amount of input samples that a processor uses to generate each output sample. The more input samples a processor uses to generate an output sample, the less error in the output sample. For example, an output signal has less signal error if the input sample quantity is 1024 as opposed to 128 (pre-defined process block 340, see FIG. 4 and corresponding text for further details). Error function store 350 may be stored on a volatile or nonvolatile storage area, such as internal memory or a computer hard drive.

Processing generates an accumulated output sample value for each output sample point using the input samples. Processing then identifies an error function value using the error function located in error function store 350, multiplies the error function value by an average signal value, which results in a weighted signal average. The weighted signal average is then added to the accumulated output sample value, which results in a corrected output sample value. Each corrected output sample value for each output sample point is stored in output store 370 (pre-defined process block 360, see FIG. 5 and corresponding text for further details). Output store 370 may be stored on a volatile or nonvolatile storage area, such as computer memory or a computer hard drive.

At step 380, processing generates output signal 390 using the corrected output sample values that are located in output store 370. As one skilled in the art can appreciate, output signal 390 may be generated without the intermediary step of storing the corrected output sample values to output store 370. Processing ends at 395.

Figure 4:
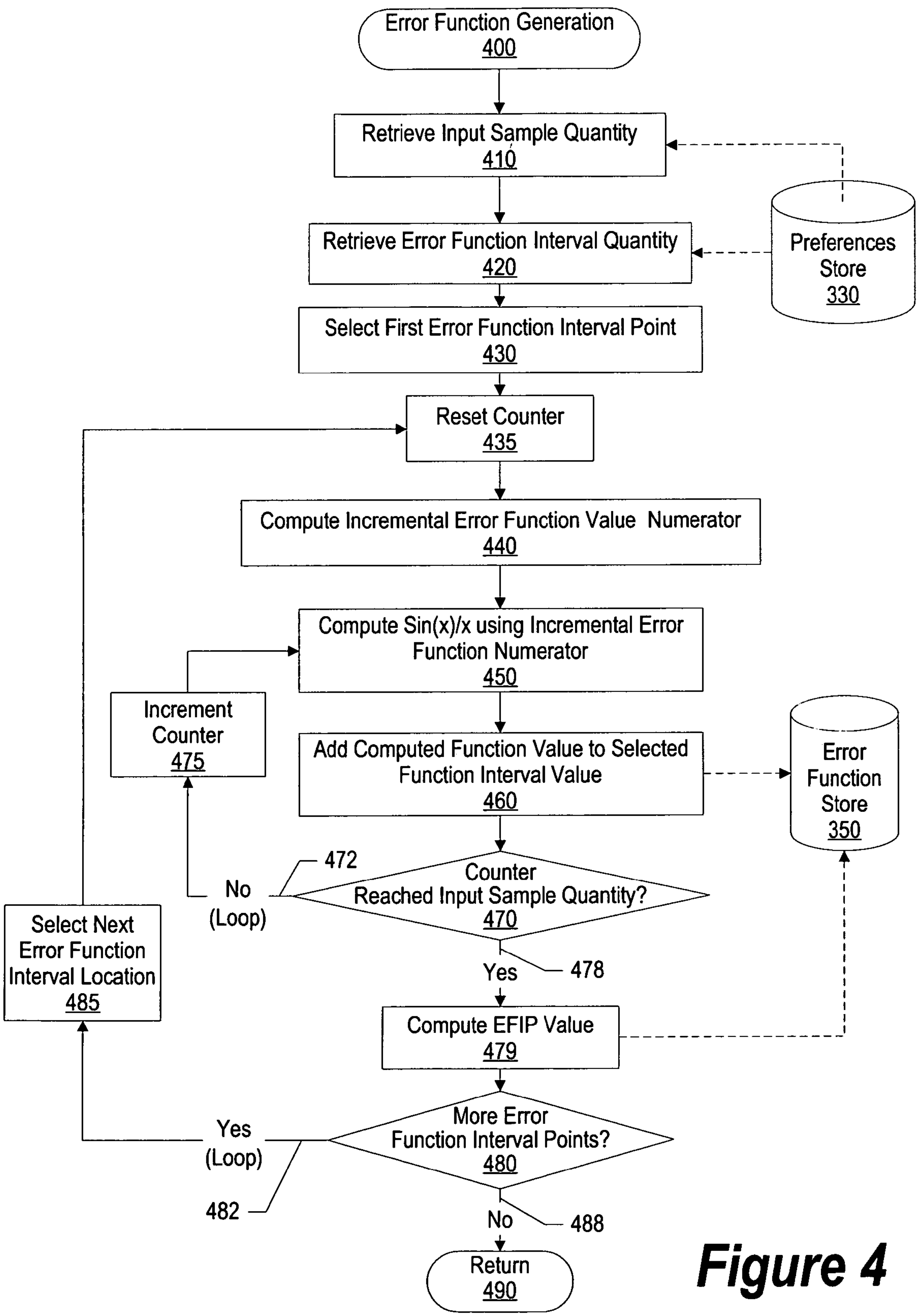
FIG. 4 is a flowchart showing steps taken in generating an error function.

FIG. 4 is a flowchart showing steps taken in generating an error function. An error function includes error function values that correspond to a distance between an input sample point and an output sample point. The farther away the output sample point is from the mid-point between two input sample points, the larger the error function value (see FIG. 2 and corresponding text for further details regarding error function properties).

Error function generation processing commences at 400, whereupon processing retrieves an input sample quantity from preferences store 330 at step 410. The input sample quantity identifies an amount of input samples a processor uses in order to generate each output sample. The more input samples a processor uses to generate an output sample, the less error in the output sample. For example, an output sample has less signal error if the input sample quantity is 1024 as opposed to 128. Preferences store 330 is the same as that shown in FIG. 3 and may be stored on a nonvolatile storage area, such as a computer hard drive.

At step 420, processing retrieves an error function interval quantity. The error function interval quantity is an amount of intervals, or points, to calculate an error function value corresponding to the error function. For example, if the error function interval quantity is 64, then processing calculates 64 error function values, in addition to the first end point, in order to generate an error function value curve.

Processing selects the first error function interval point (EFIP) at step 430. Using the example described above, if the error function interval quantity is 64, the first error function interval point is 1⁄64. Processing resets a counter (CNT) at step 435, which is used during the generation of incremental error function values up until the counter reaches the input sample quantity. At step 440, processing computes an incremental error function numerator (IEFN) using the error function interval point and the input sample quantity (Ns) as follows:

$$IEFN=-Ns/2+EFIP+CNT$$

Using the example described above, if the input sample quantity is 256, the first IEFN for the first error function interval point is:

$$IEFN=-256/2+1/64+0=-127\,63/64$$

At step 450, processing computes an incremental function value (IFV) using the incremental error function numerator as follows:

$$IFV=(\sin(IEFN*Pi))/(IEFN*Pi)$$

Using the example described above, the first incremental function value is as follows:

$$IFV=(\sin(-127\,63/64*Pi))/(-127\,63/64*Pi)=0.00062$$

Processing adds the incremental function value to the selected error function interval point value in error function store 350 (step 460). Error function store 350 is the same as that shown in FIG. 3. A determination is made as to whether the counter has reached the input sample quantity (decision 470). If the counter has not reached the input sample quantity, decision 470 branches to "No" branch 472 which loops back to increment the counter (step 475) and generate another incremental error function numerator and another incremental function value. This looping continues until the counter reaches the input sample quantity, at which point decision 470 branches to "Yes" branch 478. The sum of the accumulated incremental function values is subtracted from "1.0" to yield the actual function value of the error function at the selected error function interval point (step 479).

A determination is made as to whether there are more error function interval points (decision 480). If there are more error function interval points, decision 480 branches to "Yes" branch 482 whereupon processing selects the next error function interval point at step 485 (e.g. 2/64), and generates an error function interval value for the next error function interval point. This looping continues until there are no more error function interval points for which to generate an error function interval value, at which point decision 480 branches to "No" branch 488 whereupon processing returns at 490.

Figure 5:
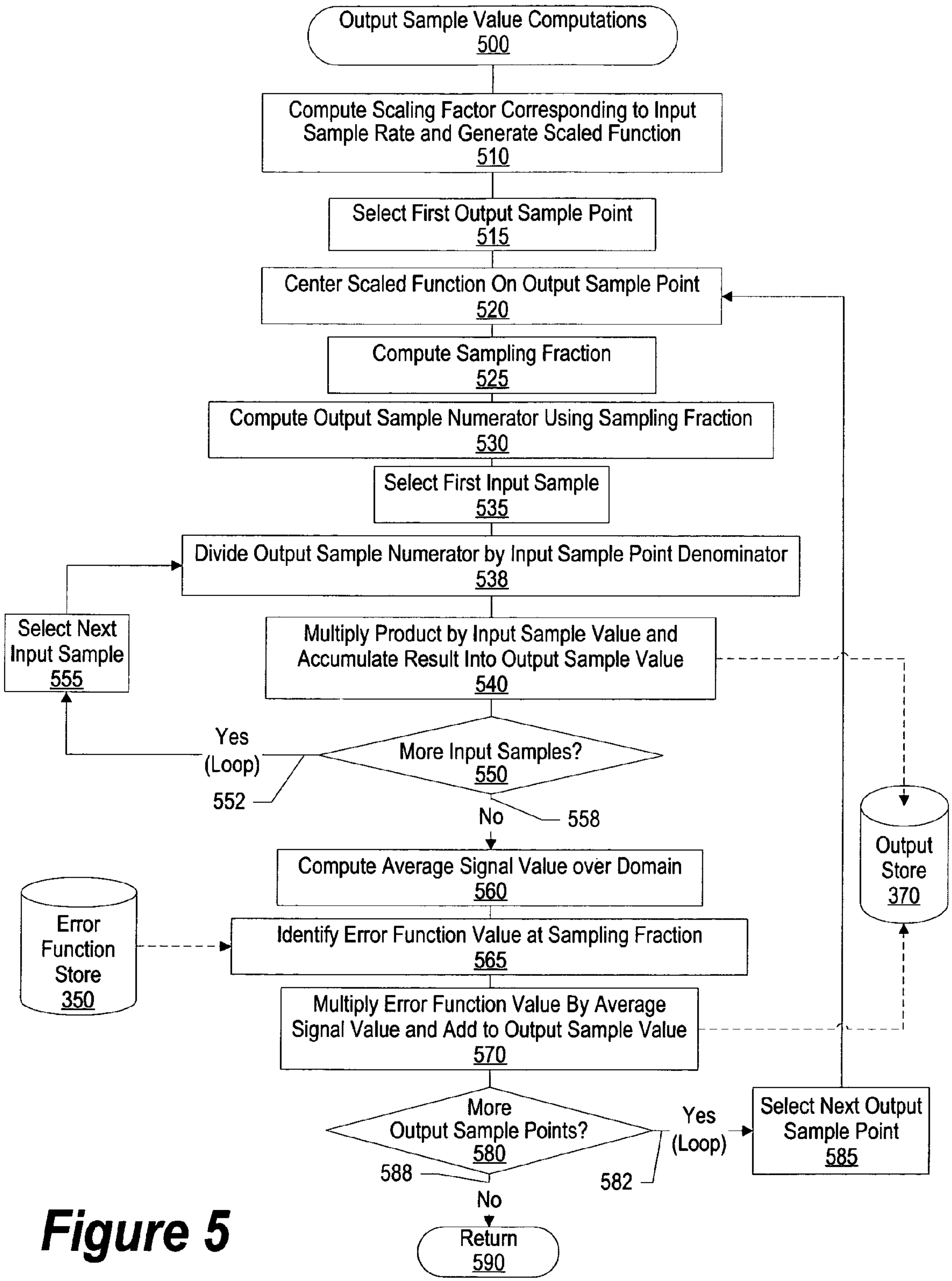
FIG. 5 is a flowchart showing steps taken in generating corrected output sample values for a plurality of output sample points.

FIG. 5 is a flowchart showing steps taken in generating corrected output sample values for a plurality of output sample points. For each output sample point, processing generates an accumulated output sample using a particular number of input samples, and then adds a weighted signal average to the accumulated output sample in order to generate a corrected output sample value. The weighted signal average is based upon the average signal value and the distance between an output sample point and an input sample point.

Processing commences at 500, whereupon processing computes a scaling factor that corresponds to the input sample rate (step 510). The input sample rate is a sample rate that corresponds to an input signal, such as 44 KHz. Processing uses the scaling factor to generate a scaled function. The scaled function is the function sin (x)/x in that, using the scaling factor, the function crosses the x-axis at the same frequency as the input sample rate.

Processing selects a first output sample point at step 515. At step 520, processing centers the scaled function on the output sample point. Since the scaled function is scaled to the input sample rate, one input sample point exists between the center of the function and the point at which the function crosses the x-axis (see FIG. 1 and corresponding text for further details regarding scaled function properties).

At step 525, processing computes a sampling fraction (SF) using the following formula:

*SF*=center to input sample/center to cross the X axis

The sampling fraction is the same value for each of the input samples because the sampling function is scaled based upon the input sample rate. For example, if the input sample is 0.8 away from the center (e.g. output sample point), and the sample function crosses the x-axis at 1.0 away from the output sample point, the sampling fraction is 0.8/1.0=0.8.

At step 530, processing calculates an output sample numerator (OSN) using the sampling fraction as follows:

$OSN=\sin(SF*Pi)$

Using the example described above, $OSN=sin(0.8*Pi)=0.599$

Processing selects a first input sample at step 535. For example, processing may use 1024 samples to calculate each output sample, whereby 512 input samples are on each side of the output sample point. Processing computes a denominator that is the absolute value of the scaled distance (SD) from the temporal location of the desired output signal to the temporal location of the input sample in question. For example, if the scaling fraction is 0.8, the scaled distances to the six closest neighbors (three on the left and three on the right) are (2.2*Pi), (1.2*Pi), (0.2*Pi), (0.8*Pi), (1.8*Pi) and (2.8*Pi).

At step 538, processing divides the output sample numerator by the denominator to calculate a function weighting (FW). Using the example described above:

$FW=OSN/(SD*Pi)=0.599/2.496=0.240$

Since the values of the function switch sign, with the two closest neighbors (left and right neighbor to output signal) being both positive, and then alternating between negative and positive as sample points to the left and to the right are computed, the sign change also has to be multiplied in to the computed term. One approach is to look at truncated-to-integer values of the denominator before multiplying by Pi. Using the example described above, these would be 2.2, 1.2, 0.2, 0.8, 1.8 and 2.8. After truncation, the results are 2, 1, 0, 0, 1, 2, respectively. By performing a logical "AND" with these results and "1" results in 0, 1, 0, 0, 1, 0, respectively. These results may be multiplied by −1, yielding 0, −1, 0, 0, −1, 0, respectively, which may be multiplied into the numerator, achieving the desired sign alternation.

The function weighting is multiplied by the input sample value in order to generate an incremental output sample value. For example, if the input sample value is 4.2, the incremental output sample value (IOSV) is calculated as follows:

$IOSV=4.2*0.240=1.008$

The incremental output sample value is accumulated into an output sample value located in output store 370 for the particular output sample point (step 540). Output store 370 is the same as that shown in FIG. 3. A determination is made as to whether there are more input samples for which to generate an incremental output sample value (decision 550). If there are more input samples to generate an incremental output sample value, decision 550 branches to "Yes" branch 552 which loops back to select (step 555) and processes the next input sample. This looping continues until there are no more input samples to process, at which point decision 550 branches to "No" branch 558.

Processing computes an average signal value over the domain at step 560. At step 565, processing identifies an error function value that corresponds to the sampling fraction using the error function that is located in error function store 350. Using the example described above, since the sampling fraction is 0.8, processing identifies an error function value that corresponds to an error function point of 0.8 (see FIGS. 2, 4, and corresponding text for further details regarding error function properties). Error function store 350 is the same as that shown in FIG. 3.

At step 570, processing generates a weighted signal average by multiplying the average signal value by the error function value. At step 570, processing adds the weighted signal average to the accumulated output sample value, which results in a corrected output sample value.

A determination is made as to whether there are more output sample points to generate a corrected output sample value (decision 580). If there are more output sample points to generate a corrected output sample value, decision 580 branches to "Yes" branch 582 which loops back to select (step 585) and process the next output sample point. This looping continues until there are no more output sample points to compute corrected output sample values, at which point decision 580 branches to "No" branch 588 whereupon processing returns at 590.

Figure 6:
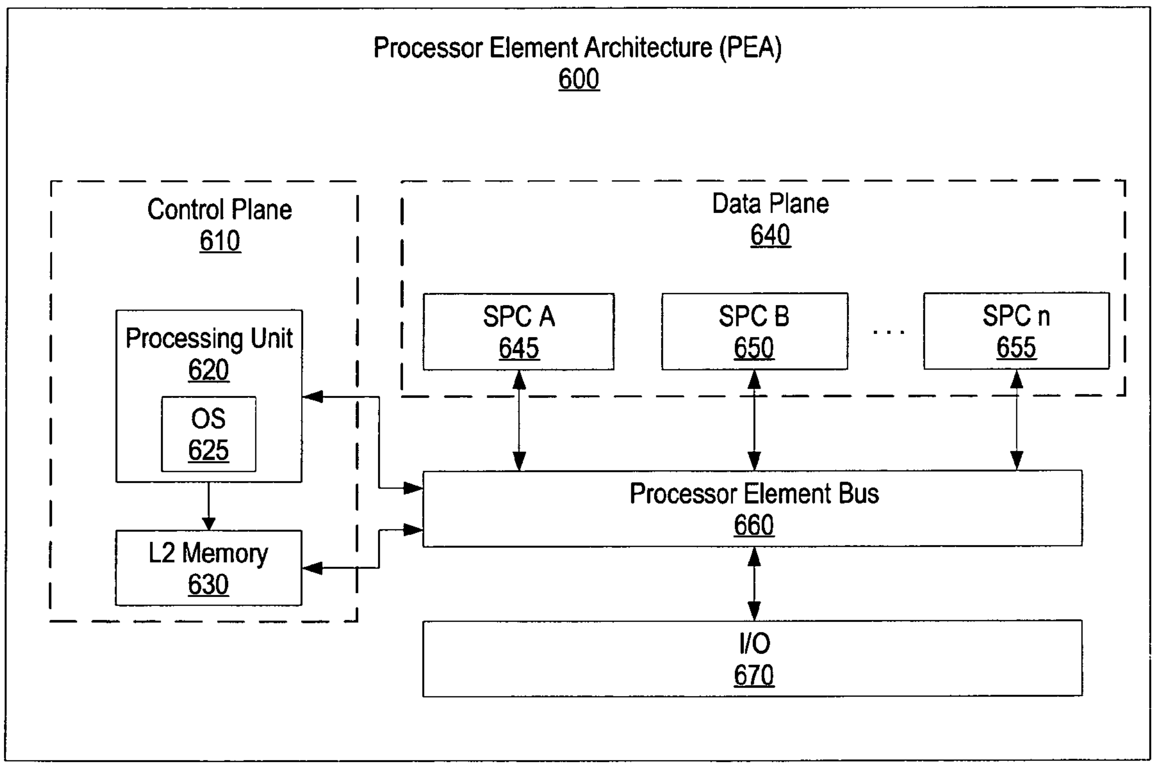
FIG. 6 is a diagram showing a processor element architecture that includes a plurality of heterogeneous processors.

FIG. 6 is a diagram showing a processor element architecture that includes a plurality of heterogeneous processors. The heterogeneous processors share a common memory and a common bus. Processor element architecture (PEA) 600 sends and receives information to/from external devices through input output 670, and distributes the information to control plane 610 and data plane 640 using processor element bus 660. Control plane 610 manages PEA 600 and distributes work to data plane 640.

Control plane 610 includes processing unit 620 which runs operating system (OS) 625. For example, processing unit 620 may be a Power PC core that is embedded in PEA 600 and OS 625 may be a Linux operating system. Processing unit 620 manages a common memory map table for PEA 600. The memory map table corresponds to memory locations included in PEA 600, such as L2 memory 630 as well as non-private memory included in data plane 640 (see FIG. 7A, 11B, and corresponding text for further details regarding memory mapping).

Data plane 640 includes Synergistic Processing Complex's (SPC) 645, 650, and 655. Each SPC is used to process data information and each SPC may have different instruction sets. For example, PEA 600 may be used in a wireless communications system and each SPC may be responsible for separate processing tasks, such as modulation, chip rate processing, encoding, and network interfacing. In another example, each SPC may have identical instruction sets and may be used in parallel to perform operations benefiting from parallel processes. Each SPC includes a synergistic processing unit (SPU) which is a processing core, such as a digital signal processor, a microcontroller, a microprocessor, or a combination of these cores.

SPC 645, 650, and 655 are connected to processor element bus 660 which passes information between control plane 610, data plane 640, and input/output 670. Bus 660 is an on-chip coherent multi-processor bus that passes information between I/O 670, control plane 610, and data plane 640. Input/output 670 includes flexible input-output logic which dynamically assigns interface pins to input output controllers based upon peripheral devices that are connected to PEA 600. For example, PEA 600 may be connected to two peripheral devices, such as peripheral A and peripheral B, whereby each peripheral connects to a particular number of input and output pins on PEA 600. In this example, the flexible input-output logic is configured to route PEA 600's external input and output pins that are connected to peripheral A to a first input output controller (i.e. IOC A) and route PEA 600's external input and output pins that are connected to peripheral B to a second input output controller (i.e. IOC B).

Figure 7A:
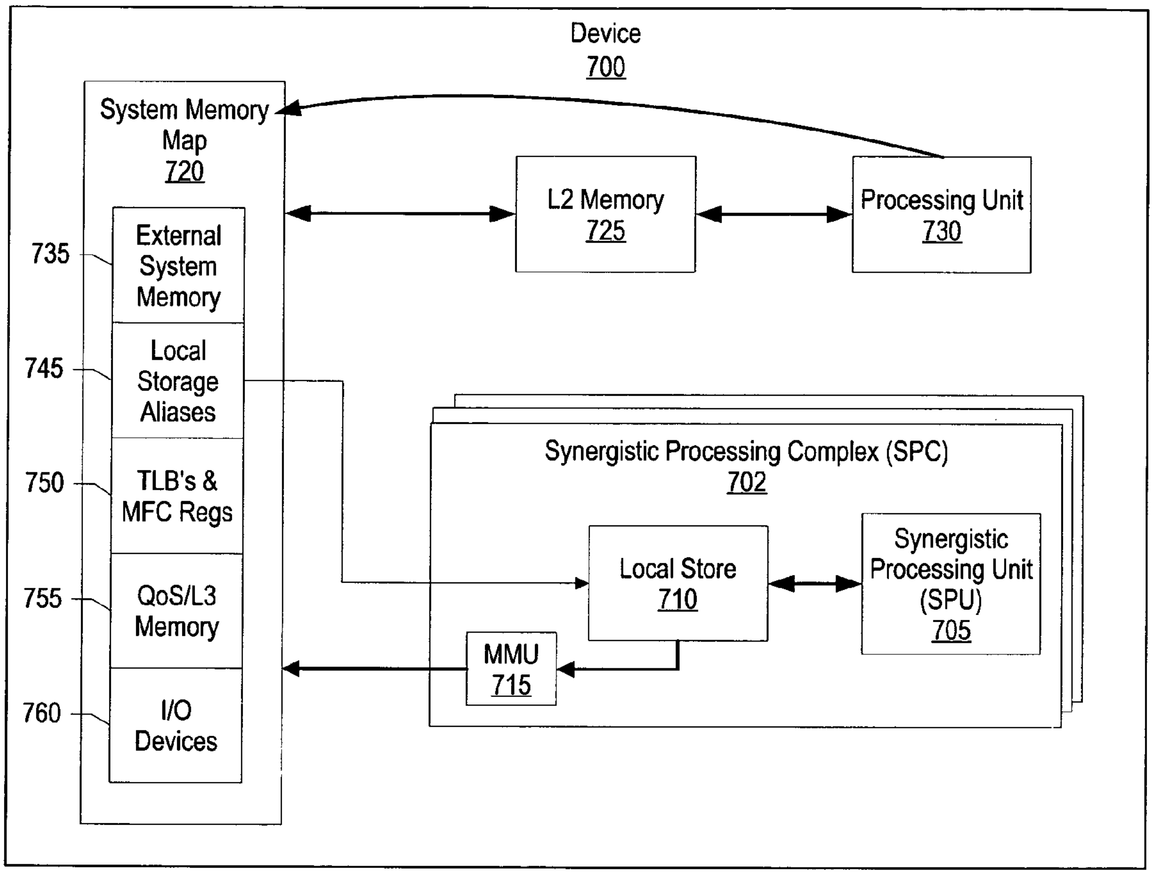
FIG. 7A illustrates a first information handling system which is a simplified example of a computer system capable of performing the computing operations described herein.

FIG. 7A illustrates a first information handling system which is a simplified example of a computer system capable of performing the computing operations described herein. The example in FIG. 7A shows a plurality of heterogeneous processors using a common memory map in order to share memory between the heterogeneous processors. Device 700 includes processing unit 730 which executes an operating system for device 700. Processing unit 730 is similar to processing unit 620 shown in FIG. 6. Processing unit 730 uses system memory map 720 to allocate memory space throughout device 700. For example, processing unit 730 uses system memory map 720 to identify and allocate memory areas when processing unit 730 receives a memory request. Processing unit 730 accesses L2 memory 725 for retrieving application and data information. L2 memory 725 is similar to L2 memory 630 shown in FIG. 6.

System memory map 720 separates memory-mapping areas into regions which are regions 735, 745, 750, 755, and 760. Region 735 is a mapping region for external system memory which may be controlled by a separate input output device. Region 745 is a mapping region for non-private storage locations corresponding to one or more synergistic processing complexes, such as SPC 702. SPC 702 is similar to the SPC's shown in FIG. 6, such as SPC A 645. SPC 702 includes local memory, such as local store 710, whereby portions of the local memory may be allocated to the overall system memory for other processors to access. For example, 1 MB of local store 710 may be allocated to non-private storage whereby it becomes accessible by other heterogeneous processors. In this example, local storage aliases 745 manages the 1 MB of nonprivate storage located in local store 710.

Region 750 is a mapping region for translation lookaside buffer's (TLB's) and memory flow control (MFC registers. A translation lookaside buffer includes cross-references between virtual address and real addresses of recently referenced pages of memory. The memory flow control provides interface functions between the processor and the bus such as DMA control and synchronization.

Region 755 is a mapping region for the operating system and is pinned system memory with bandwidth and latency guarantees. Region 760 is a mapping region for input output devices that are external to device 700 and are defined by system and input output architectures.

Synergistic processing complex (SPC) 702 includes synergistic processing unit (SPU) 705, local store 710, and memory management unit (MMU)-715. Processing unit 730 manages SPU 705 and processes data in response to processing unit 730's direction. For example SPU 705 may be a digital signaling processing core, a microprocessor core, a micro controller core, or a combination of these cores. Local store 710 is a storage area that SPU 705 configures for a private storage area and a non-private storage area. For example, if SPU 705 requires a substantial amount of local memory, SPU 705 may allocate 100% of local store 710 to private memory. In another example, if SPU 705 requires a minimal amount of local memory, SPU 705 may allocate 10% of local store 710 to private memory and allocate the remaining 90% of local store 710 to non-private memory (see FIG. 7B and corresponding text for further details regarding local store configuration).

The portions of local store 710 that are allocated to non-private memory are managed by system memory map 720 in region 745. These non-private memory regions may be accessed by other SPU's or by processing unit 730. MMU 715 includes a direct memory access (DMA) function and passes information from local store 710 to other memory locations within device 700.

Figure 7B:
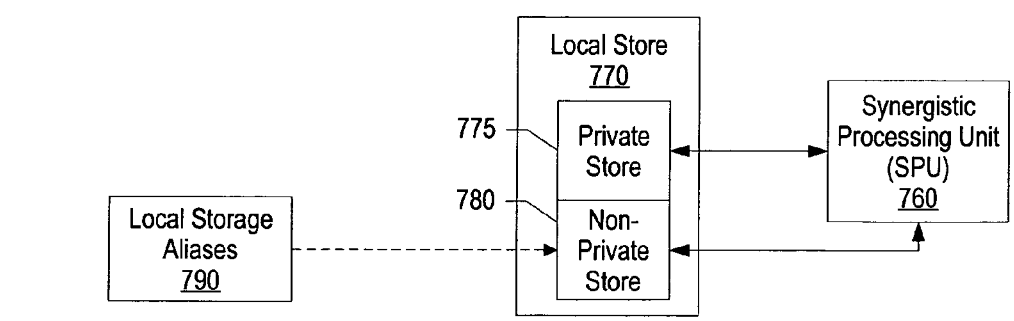
FIG. 7B is a diagram showing a local storage area divided into private memory and non-private memory.

FIG. 7B is a diagram showing a local storage area divided into private memory and non-private memory. During system boot, synergistic processing unit (SPU) 760 partitions local store 770 into two regions which are private store 775 and non-private store 780. SPU 760 is similar to SPU 705 and local store 770 is similar to local store 710 that are shown in FIG. 7A. Private store 775 is accessible by SPU 760 whereas non-private store 780 is accessible by SPU 760 as well as other processing units within a particular device. SPU 760 uses private store 775 for fast access to data. For example, SPU 760 may be responsible for complex computations that require SPU 760 to quickly access extensive amounts of data that is stored in memory. In this example, SPU 760 may allocate 100% of local store 770 to private store 775 in order to ensure that SPU 760 has enough local memory to access. In another example, SPU 760 may not require a large amount of local memory and therefore, may allocate 10% of local store 770 to private store 775 and allocate the remaining 90% of local store 770 to non-private store 780.

A system memory-mapping region, such as local storage aliases 790, manages portions of local store 770 that are allocated to non-private storage. Local storage aliases 790 is similar to local storage aliases 745 that is shown in FIG. 7A. Local storage aliases 790 manages non-private storage for each SPU and allows other SPU's to access the non-private storage as well as a device's control processing unit.

Figure 8:
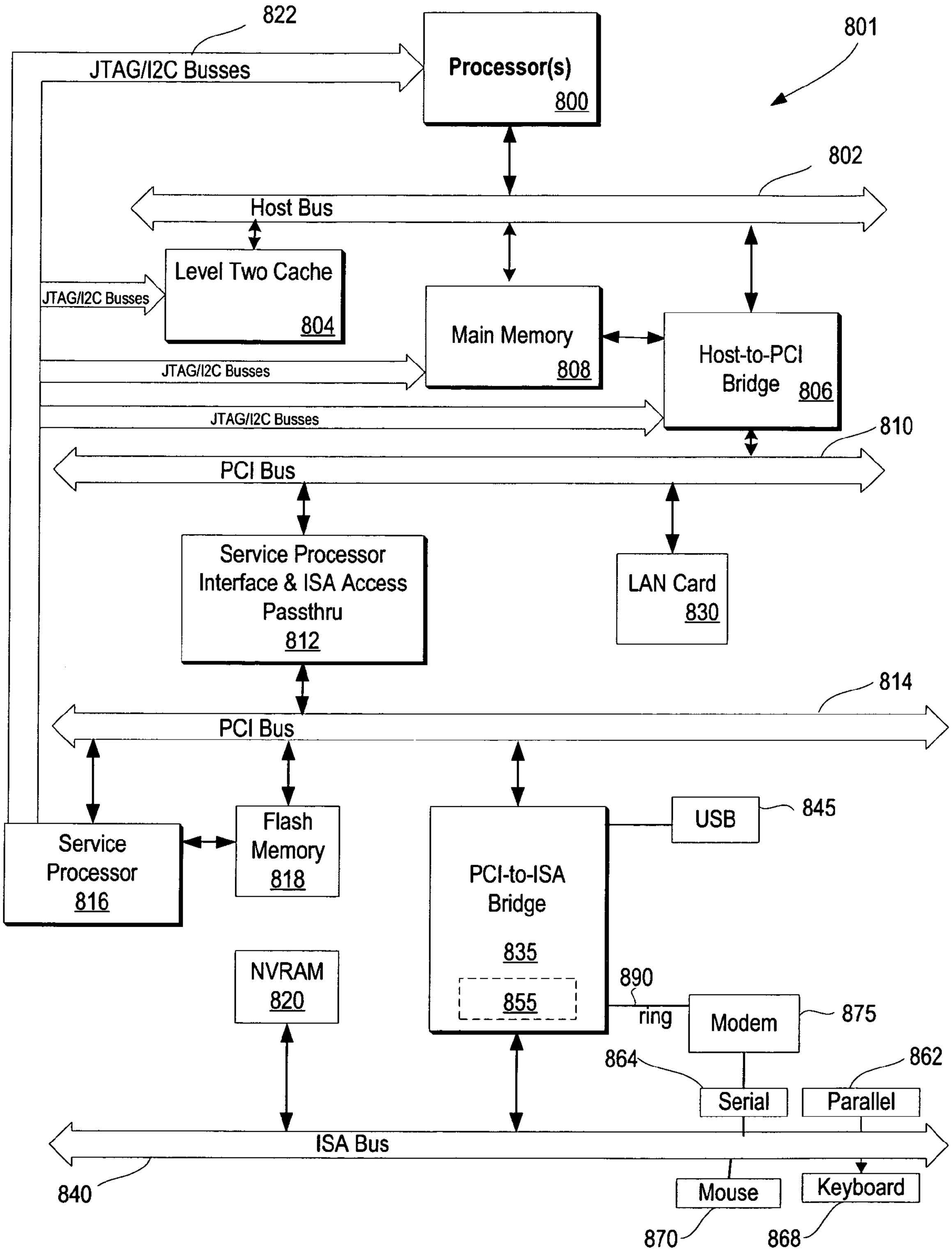
FIG. 8 is a block diagram of a second information handling system capable of implementing the present invention.

FIG. 8 illustrates information handling system 801 which is a simplified example of a computer system capable of performing the computing operations described herein. Computer system 801 includes processor 800 which is coupled to host bus 802. A level two (L2) cache memory 804 is also coupled to host bus 802. Host-to-PCI bridge 806 is coupled to main memory 808, includes cache memory and main memory control functions, and provides bus control to handle transfers among PCI bus 810, processor 800, L2 cache 804, main memory 808, and host bus 802. Main memory 808 is coupled to Host-to-PCI bridge 806 as well as host bus 802. Devices used solely by host processor(s) 800, such as LAN card 830, are coupled to PCI bus 810. Service Processor Interface and ISA Access Pass-through 812 provides an interface between PCI bus 810 and PCI bus 814. In this manner, PCI bus 814 is insulated from PCI bus 810. Devices, such as flash memory 818, are coupled to PCI bus 814. In one implementation, flash memory 818 includes BIOS code that incorporates the necessary processor executable code for a variety of low-level system functions and system boot functions.

PCI bus 814 provides an interface for a variety of devices that are shared by host processor(s) 800 and Service Processor 816 including, for example, flash memory 818. PCI-to-ISA bridge 835 provides bus control to handle transfers between PCI bus 814 and ISA bus 840, universal serial bus (USB) functionality 845, power management functionality 855, and can include other functional elements not shown, such as a real-time clock (RTC), DMA control, interrupt support, and system management bus support. Nonvolatile RAM 820 is attached to ISA Bus 840. Service Processor 816 includes JTAG and I2C busses 822 for communication with processor(s) 800 during initialization steps. JTAG/I2C busses 822 are also coupled to L2 cache 804, Host-to-PCI bridge 806, and main memory 808 providing a communications path between the processor, the Service Processor, the L2 cache, the Host-to-PCI bridge, and the main memory. Service Processor 816 also has access to system power resources for powering down information handling device 801.

Peripheral devices and input/output (I/O) devices can be attached to various interfaces (e.g., parallel interface 862, serial interface 864, keyboard interface 868, and mouse interface 870 coupled to ISA bus 840. Alternatively, many I/O devices can be accommodated by a super I/O controller (not shown) attached to ISA bus 840.

In order to attach computer system 801 to another computer system to copy files over a network, LAN card 830 is coupled to PCI bus 810. Similarly, to connect computer system 801 to an ISP to connect to the Internet using a telephone line connection, modem 875 is connected to serial port 864 and PCI-to-ISA Bridge 835.

While the computer system described in FIG. 8 is capable of executing the processes described herein, this computer system is simply one example of a computer system. Those skilled in the art will appreciate that many other computer system designs are capable of performing the processes described herein.

One of the preferred implementations of the invention is an application, namely, a set of instructions (program code) in a code module which may, for example, be resident in the random access memory of the computer. Until required by the computer, the set of instructions may be stored in another computer memory, for example, on a hard disk drive, or in removable storage such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For a non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:

selecting an output sample point from a plurality of output sample points;

generating an accumulated output sample value using a plurality of input sample points;

retrieving an error function value from a plurality of error function values, the plurality of error function values corresponding to an error function;

multiplying the error function value with an average signal value that corresponds to the plurality of input sample points, the multiplying resulting in a weighted signal average; and generating a corrected output sample value using the weighted signal average and the accumulated output sample value.

2. The method of claim 1 further comprising:

identifying an input sample quantity that corresponds to the plurality of input sample points;

identifying an error function interval quantity that corresponds to the error function, the error function interval quantity corresponding to a plurality of error function intervals; and computing the plurality of error function values for each of the plurality of error function intervals using each of the plurality of input sample points.

3. The method of claim 2 wherein each of the plurality of error function values increases as the input sample quantity decreases.

4. The method of claim 1 further comprising:

identifying an input sample rate that corresponds to the plurality of input sample points;

computing a scaling factor using the input sample rate; and generating a scaled function using the scaling factor.

5. The method of claim 4 wherein the scaled function is centered on the output sample point.

6. The method of claim 4 wherein a sampling fraction corresponds to the distance between the input sample point and a scaled function crossover point, the scaled function crossover point corresponding to the scaled function, and the sampling fraction corresponding to the error fraction value.

7. The method of claim 1 whereby the method is performed using a plurality of heterogeneous processors.

8. A program product comprising:

computer operable medium having computer program code, the computer program code being effective to:

select an output sample point from a plurality of output sample points;

generate an accumulated output sample value using a plurality of input sample points;

retrieve an error function value from a plurality of error function values, the plurality of error function values corresponding to an error function;

multiply the error function value with an average signal value that corresponds to the plurality of input sample points, the multiplying resulting in a weighted signal average; and generate a corrected output sample value using the weighted signal average and the accumulated output sample value.

9. The program product of claim 8 wherein the computer program code is further effective to:

identify an input sample quantity that corresponds to the plurality of input sample points;

identify an error function interval quantity that corresponds to the error function, the error function interval quantity corresponding to a plurality of error function intervals; and compute the plurality of error function values for each of the plurality of error function intervals using each of the plurality of input sample points.

10. The program product of claim 9 wherein each of the plurality of error function values increases as the input sample quantity decreases.

11. The program product of claim 8 wherein the computer program code is further effective to:

identify an input sample rate that corresponds to the plurality of input sample points;

compute a scaling factor using the input sample rate; and generate a scaled function using the scaling factor.

12. The program product of claim 11 wherein the scaled function is centered on the output sample point.

13. The program product of claim 11 wherein a sampling fraction corresponds to the distance between the input sample point and a scaled function crossover point, the scaled function crossover point corresponding to the scaled function, and the sampling fraction corresponding to the error fraction value.

14. The program product of claim 8 wherein the computer program code is further effective to:

generate an output signal using the corrected output sample value.

15. An information handling system comprising:

a display;

one or more processors;

a memory accessible by the processors;

one or more nonvolatile storage devices accessible by the processors; and a re-sampling tool for generating an output signal, the re-sampling tool comprising software code effective to:

select an output sample point from a plurality of output sample points that are located in one of the nonvolatile storage devices;

generate an accumulated output sample value using a plurality of input sample points;

retrieve an error function value from a plurality of error function values, the plurality of error function values corresponding to an error function and located in one of the nonvolatile storage devices;

multiply the error function value with an average signal value that corresponds to the plurality of input sample points, the multiplying resulting in a weighted signal average; and generate a corrected output sample value using the weighted signal average and the accumulated output sample value.

16. The information handling system of claim 15 wherein the computer program code is further effective to:

identify an input sample quantity that corresponds to the plurality of input sample points;

identify an error function interval quantity that corresponds to the error function, the error function interval quantity corresponding to a plurality of error function intervals and located in one of the nonvolatile storage devices; and compute the plurality of error function values for each of the plurality of error function intervals using each of the plurality of input sample points.

17. The information handling system of claim 16 wherein each of the plurality of error function values increases as the input sample quantity decreases.

18. The information handling system of claim 15 wherein the computer program code is further effective to:

identify an input sample rate that is located in one of the nonvolatile storage devices that corresponds to the plurality of input sample points;

compute a scaling factor using the input sample rate; and generate a scaled function using the scaling factor.

19. The information handling system of claim 18 wherein the scaled function is centered on the output sample point.

20. The information handling system of claim 18 wherein a sampling fraction corresponds to the distance between the input sample point and a scaled function crossover point, the scaled function crossover point corresponding to the scaled function, and the sampling fraction corresponding to the error fraction value.

* * * * *